(12) United States Patent
Lee et al.

(10) Patent No.: US 7,652,306 B2
(45) Date of Patent: Jan. 26, 2010

(54) LIGHT EMITTING DIODE PACKAGE

(75) Inventors: Jin-Won Lee, Yongin-si (KR); Kyoung-Il Park, Busan (KR); Sun-Hong Kim, Incheon (KR)

(73) Assignee: Alti-Electronics Co., Ltd, Yongin-si, Gyeonggi-do (KR)

( * ) Notice: Subject to any disclaimer, the term of this patent is extended or adjusted under 35 U.S.C. 154(b) by 0 days.

(21) Appl. No.: 12/078,107

(22) Filed: Mar. 27, 2008

(65) Prior Publication Data

US 2009/0189174 A1    Jul. 30, 2009

(30) Foreign Application Priority Data

Jan. 28, 2008    (KR) ...................... 10-2008-0008519

(51) Int. Cl.
*H01L 33/00* (2006.01)

(52) U.S. Cl. .......................... 257/99; 257/100; 257/103

(58) Field of Classification Search .......... 257/98–100, 257/103
See application file for complete search history.

(56) References Cited

U.S. PATENT DOCUMENTS

2007/0096114 A1 *  5/2007  Aoki et al. ..................... 257/79

* cited by examiner

*Primary Examiner*—Thien F Tran
(74) *Attorney, Agent, or Firm*—The Nath Law Group; Jerald L. Meyer; Sungyeop Chung

(57) ABSTRACT

A light-emitting diode ("LED") package is disclosed. The LED package includes a substrate, a pad frame, an LED chip and a housing. The pad frame includes a conductive lead divided by insulation materials on the substrate. The LED chip is mounted on the conductive lead. The housing surrounds the LED chip and the conductive lead, and has opening recess exposing the LED chip and a part of the conductive lead. The conductive lead includes a protrusion extended in both directions substantially perpendicular to a longitudinal direction of the housing.

5 Claims, 3 Drawing Sheets

LIGHT EMITTING DIODE PACKAGE

CROSS-REFERENCE TO RELATED APPLICATIONS

This application claims priority under 35 U.S.C. § 119 to Korean Patent Application No. 10-2008-0008519, filed on Jan. 28, 2008 in the Korean Intellectual Property Office (KIPO), the contents of which are herein incorporated by reference in their entirety.

BACKGROUND OF THE INVENTION

1. Field of the Invention

The present invention relates to a light-emitting diode ("LED") package. More particularly, the present invention relates to an LED improving heat dissipation.

2. Description of the Related Art

A light-emitting diode ("LED") is a kind of a semiconductor device converting electrical energy into optical energy, and is composed of semiconductor compounds emitting light having a specific wavelength according to an energy band gap. Recently, applications of the LED are varied, and the uses of the LED are increased. The LED is provided as a package according to the objects and the required shape. An LED package protect an LED chip, which emits light when a power is supplied to the LED chip, from external condition such as dust, moisture, electrical and mechanical loads. Signal input/output terminals of the LED package are formed by using a lead frame, a printed circuit board ("PCB"), etc, and the LED package is molded by using an encapsulant. Thus, the LED package optimizes electrical performance of the LED chip.

In general, the LED package is manufactured by mounting an LED chip on a substrate or a lead frame and electrically connecting a device of the chip and an electrode pad. However, a package molding member is formed to surround the lead frame completely, and the heat of the LED chip is not dissipated well when the LED chip is manufactured to have a lot of heat dissipation for high performance and efficiency. When the heat of the LED chip is not dissipated enough, the life cycle of the LED chip is remarkably reduced.

SUMMARY OF THE INVENTION

The present invention provides a light-emitting diode ("LED") package dissipating heat effectively.

In one aspect of the present invention, a light-emitting diode ("LED") package includes a substrate, a pad frame, an LED chip and a housing. The pad frame includes a conductive lead divided by insulation materials on the substrate. The LED chip is mounted on the conductive lead. The housing surrounds the LED chip and the conductive lead, and has opening recess exposing the LED chip and a part of the conductive lead. The conductive lead includes a protrusion extended in both directions substantially perpendicular to a longitudinal direction of the housing.

In an exemplary embodiment, an LED package includes a substrate, a pad frame, an LED chip, a voltage regulator diode and a housing. The pad frame includes a first inner lead, a second inner lead and an outer lead divided by insulation materials on the substrate, and the second inner lead faces the first inner lead. An LED chip is mounted on the first inner lead. The voltage regulator diode is mounted on the second inner lead. The housing surrounds the LED chip, the voltage regulator diode and the first and second leads, and has opening recess exposing the LED chip, the voltage regulator diode and a part of the first and second leads. The first and second leads include a protrusion extended in both directions substantially perpendicular to a longitudinal direction of the housing.

According to the present invention, heat generated at an LED chip can be dissipated easily by simple structure change of a lead frame, so that heat dissipation is excellent. Thus, deterioration by heat, a reduce of life-cycle of the LED chip and a reduce of light amount are prevented.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

Figure 1:
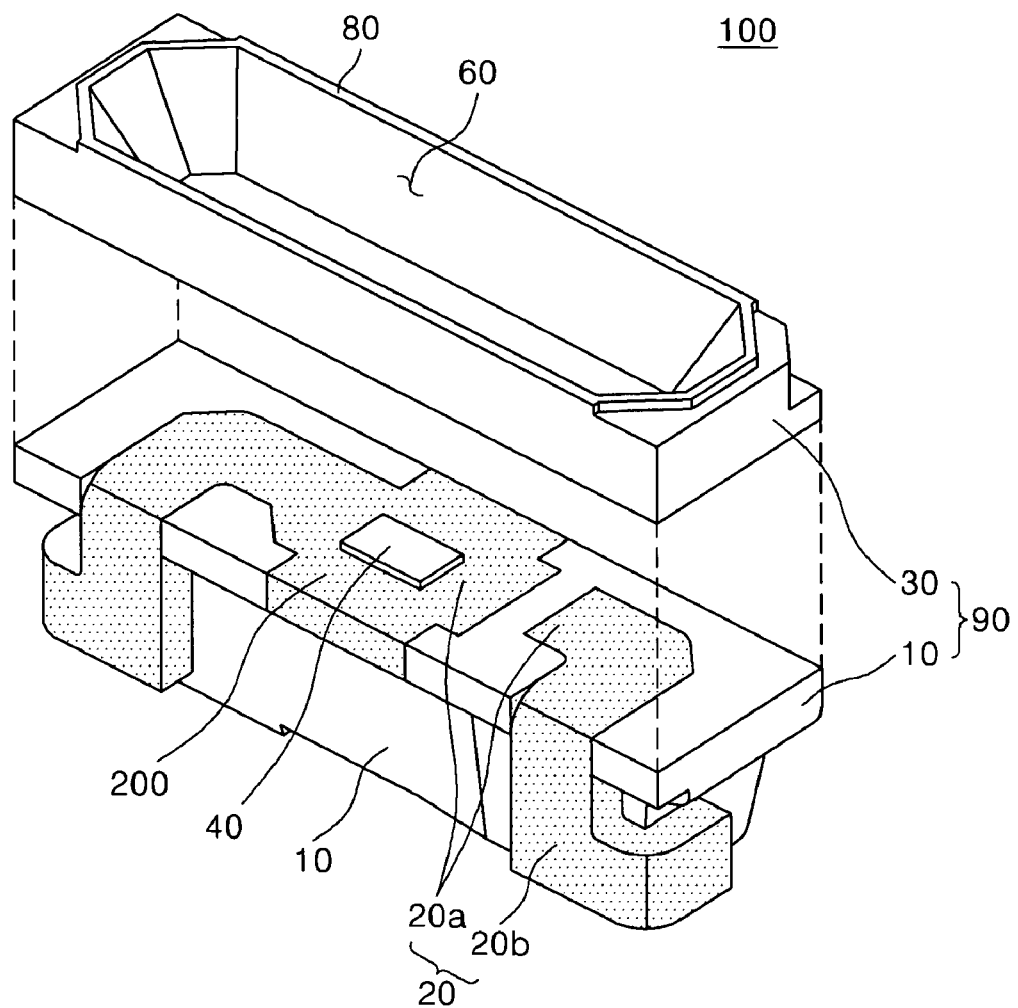
FIG. 1 is a perspective cross-sectional view illustrating a light-emitting diode ("LED") package in accordance with an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Figure 2:
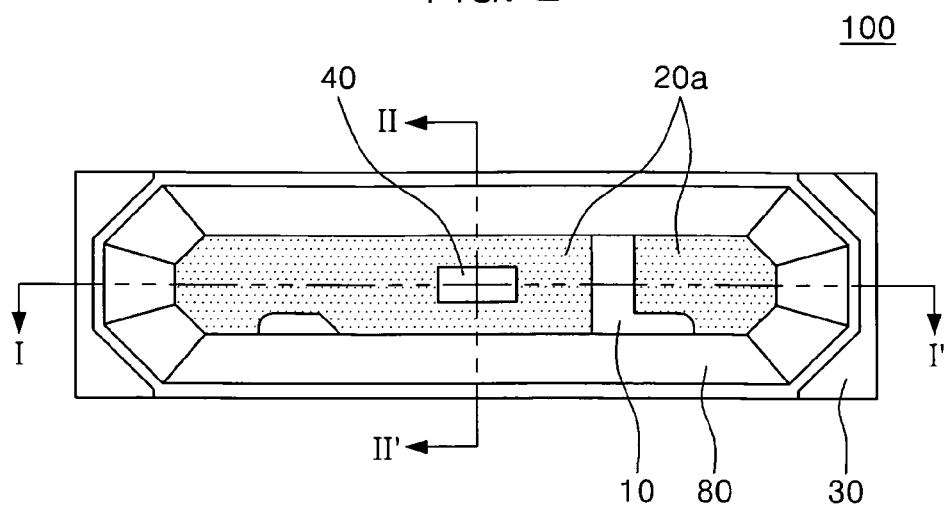
FIG. 2 is a plan view illustrating an LED package in accordance with an exemplary embodiment of the present invention.

FIG. 1 is a perspective cross-sectional view illustrating a light-emitting diode ("LED") package in accordance with an exemplary embodiment of the present invention. FIG. 2 is a plan view illustrating an LED package in accordance with an exemplary embodiment of the present invention.

Referring to FIGS. 1 and 2, an LED package 100 includes a package housing 90, a pad frame 20, an LED chip 40 and a molding part 80.

The-package housing 90 includes a substrate 10 and a housing 30.

The substrate 10 is formed as a plate shape, and has a receiving recess for receiving the pad frame 20. The substrate 10 may include ceramic or plastics formed by a mold-injection method. For example, the substrate 10 may include high thermal conductive ceramics, which is easily applied to a narrow connecting part or space of a specific shape. The substrate 10 dissipates effectively the heat emitted from the LED chip 40.

The pad frame 20 is disposed on the substrate 10, and divided into a plurality of areas, which are electrically insulated. The pad frame 20 is divided by the substrate 10, which is insulated from conductive leads being capable for electrodes. Both of the conductive leads are disposed separately at a predetermined interval to face to each other. The pad frame 20 may include an inner lead 20a and an outer lead 20b. The inner lead 20a is mounted at a receiving recess of the substrate 10, and the outer lead 20a is extended to an outside of the substrate 10 in order to receive a power from the outside. The outside lead 20b of the pad frame 20 exposed to the outside works as an electrode of the LED package 100, and a first end portion of the pad frame 20 is formed as a cathode, and a second end portion of the pad frame 20 is formed as an anode. An end portion of the outside lead 20b of the pad frame 20 may be electrically connected to the PCB (not shown). The pad frame 20 may include metallic material having excellent electrical and heat conductivities. The pad frame 20 may include conductive material such as gold (Au), silver (Ag), copper (Cu), etc.

Moreover, the LED chip 40 is mounted at an upper portion of the inner lead 20a, and the inner lead 20a is electrically connected to the mounted LED chip 40 to apply a voltage to the LED chip 40. The inner lead 20a receiving the LED chip 40 may include a protrusion 200 protruded in both directions in order to dissipate the heat generated at the LED chip 40 to an outside of the LED package 100. The protrusion 200 is extended to passing through the housing 30, so that an area making contact with airs is increased. Thus, the LED package 100 may have a structure which is good for the heat dissipation. The protrusion 200 is extended in a direction substantially perpendicular to a longitudinal direction of the inner lead 20a, which is extended in a longitudinal direction of the housing 30. The pad frame 20 may be formed as various shapes. The number of the pad frame 20 may be decided according to the number of the LED chip 40 and a mounting method and an electrical method. At least one LED chip 40 may be fixed at the inner lead 20a of the pad frame 20.

The LED chip 40 is mounted at the inner lead 20a. A terminal of the LED chip 40 is electrically connected to the inner lead 20a with a wire. Alternatively, the terminal of the LED chip 40 may be electrically connected to the inner lead 20a by a flip-chip method. The LED chip 40 may be fixed at the substrate 10 by an adhesive member such as an epoxy resin or a eutectic solder.

A general LED chip is applied to the LED chip 40, and the LED chip 40 may include an LED chip with GaN series. The LED chip with the GaN series is manufactured to emit light having blue wavelength, and the LED chip is coated with fluorescent material emitting light having yellow wavelength, so that a mixture of the blue light and the yellow light may emit white light.

The housing 30 surrounds a pad frame 20 on the substrate 10, and may have an open recess 60. Thicknesses of the housing facing through the recess 60 to each other may be formed as substantially the same, and the housing 30 protects and supports the LED chip 40 and the pad frame 20.

The molding part 80 is formed at the housing 30 peripheral to the LED chip 40, and may be filled with an encapsulant to protect the LED chip 40 mounted in the inner lead 20a. The encapsulant is formed on the LED chip 40 disposed at the recess 60. The encapsulant is filled with transparent material to protect the LED chip 40 and to change a light proceeding course, so that light emission efficiency may be improved.

The encapsulant may include micelle, epoxy or silicon, and may include phosphors according to emitting light color of the LED chip 40 to make wavelength of the generated light longer when the phosphors are used. Epoxy resin and silicon resin, which are liquid state and not stiffed yet, are mixed to form micelle. The encapsulant material having the micelle may be form an encapsulant layer using a dispensing method.

Heights at which the encapsulant is filled may be changeable according to a kind of the chip and conditions of the chip.

Figure 3:
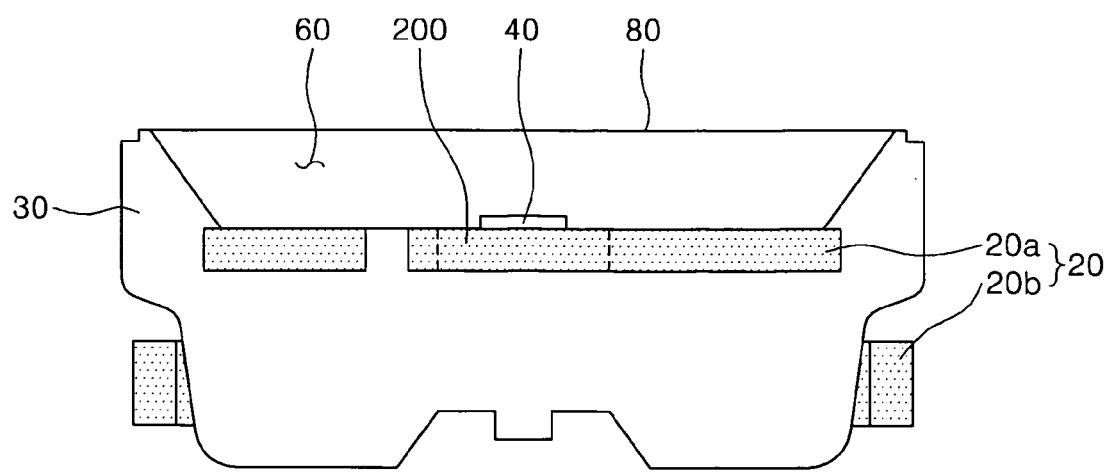
FIG. 3 is a cross-sectional view of the LED package in FIG. 2 taken along the line of I-I'.
Figure 4:
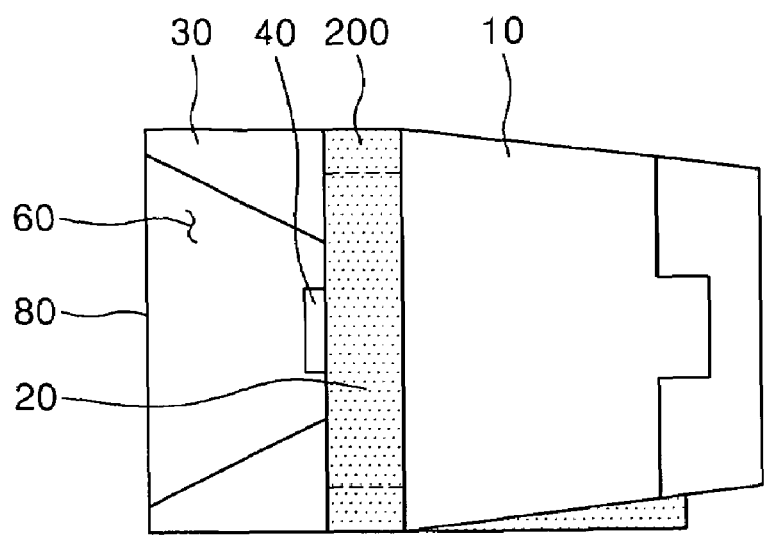
FIG. 4 is a cross-sectional view of the LED package in FIG. 2 taken along the line of II-II'.

FIG. 3 is a cross-sectional view of the LED package in FIG. 2 taken along the line of I-I'. FIG. 4 is a cross-sectional view of the LED package in FIG. 2 taken along the line of II-II'.

Referring to FIGS. 3 and 4, a protrusion 200 is formed at a longitudinal center of the inner lead 20a receiving the LED chip 40 considering light-emitting efficiency. The protrusion 200 may cool heat generated at the LED chip 40 by using external air.

Moreover, an opening area is formed wider by the recess 60, so that the light generated at the LED chip 40 emits further without loss of the light. A part of the pad frame 20 formed at the substrate 10 may be exposed, and the LED chip 40 may be mounted at the inner lead 20a of the exposed pad frame 20. The depth of the recess 60 may be a minimum depth at which the LED chip 40 is buried.

An inner face of the housing 10b defining the recess 60 is formed to have a predetermined angle at sidewalls to have a wider entrance are of mounting space than a bottom area of the mounting space. Thus, the loss of light may reduced.

Moreover, the inner surface of the housing 30 is formed by coating a reflective material or combining a reflection plate having metallic material. The reflection plate reflects light emitted from the LED chip 40 and prevents light dispersion.

Moreover, the LED package in accordance with an exemplary embodiment includes a zener diode to protect the LED from electrostatic discharge ("ESD"). The LED package may include a receiving part for receiving the zener diode.

Figure 5:
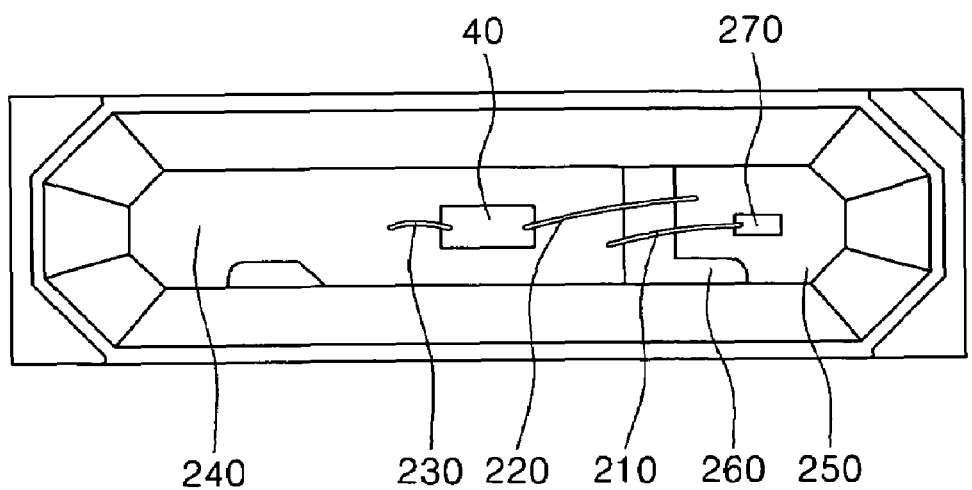
FIG. 5 is a plan view illustrating an LED package with a voltage regulator diode in accordance with an exemplary embodiment of the present invention.

FIG. 5 is a plan view illustrating an LED package with a voltage regulator diode in accordance with an exemplary embodiment of the present invention.

Referring to FIG. 5, the LED package includes a voltage regulator diode. The voltage regulator diode may include a zener diode, an aberrancy photo diode ("APD"), etc.

The voltage regulator diode 270 is mounted at an anode inner lead 250, and an LED 40 is mounted at a cathode inner lead 240. The LED 40 may be electrically connected to the anode inner lead 250 over a second wire 220. A forward current applied to the anode inner lead 250 is applied to the LED 40 through the second wire 220, so that light is emitted from the LED 40.

The voltage regulator diode 270 includes a first wire 210. The first wire 210 is extended from the voltage regulator diode 270, and is connected to the cathode inner lead 240 by a wire-bonding. The first wire 210 is electrically connected to a third wire, which is extended from the LED 40, thereby the voltage regulator diode 270 electrically connected with the LED 40 in parallel. A blocking-light dam 260 is disposed between the voltage regulator diode 270 and the LED 40. The blocking-light dam blocks the light of the LED 40, and protects the light of the LED 40 from directly irradiating into the voltage regulator diode 270. The light-blocking dam 260 may be formed by forming different heights of the substrate 10, which divides areas of the anode inner lead 250 and the cathode inner lead 240.

Thus, the voltage regulator diode 270 is disposed in parallel with the LED 40, so that damages of the LED 40 by the forward and reverse current are preventable.

In the exemplary embodiments, the LED device of the side view type is applied. However, the LED device of the present embodiment may be implemented with an LED device of the top view type, a method applying to a flash and a power LED device for lighting.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A light-emitting diode ("LED") package comprising:
    a package housing having an opening recess and two sidewalls;
    a pad frame including a plurality of conductive leads divided by insulation material,
    wherein the package housing surrounds the pad frame, exposing a portion of the conductive leads through the opening recess; and
    an LED chip mounted on one of the conductive leads, which is exposed through the opening recess,
    wherein the one of the conductive leads, on which the LED chip is mounted, extends out of both sidewalls of the package housing in a direction substantially perpendicular to a longitudinal direction of the package housing.

2. The LED package of claim 1, wherein the pad frame further comprises an outer lead which is extended out of the package housing.

3. A light-emitting diode ("LED") package comprising:
    a package housing having an opening recess and two sidewalls;
    a pad frame including a first inner lead, a second inner lead and an outer lead divided by insulation materials,
    wherein the package housing surrounds the pad frame, exposing the first inner lead and the second inner lead through the opening recess;
    an LED chip mounted on the first inner lead; and
    a voltage regulator diode mounted on the second inner lead,
    wherein the first inner lead extends out of both sidewalls of the package housing in a direction substantially perpendicular to a longitudinal direction of the package housing.

4. The LED package of claim 3, wherein the voltage regulator diode is electrically connected with the LED chip in parallel.

5. The LED package of claim 3, wherein the first inner lead and the second inner lead are a cathode and an anode, respectively.

\* \* \* \* \*